United States Patent

(12) United States Patent
Jeong

(10) Patent No.: US 9,425,782 B2
(45) Date of Patent: Aug. 23, 2016

(54) RADIO-FREQUENCY SWITCH

(71) Applicant: SAMSUNG ELECTRO-MECHANICS CO., LTD., Suwon-Si, Gyeonggi-Do (KR)

(72) Inventor: Chan Yong Jeong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 43 days.

(21) Appl. No.: 14/278,986

(22) Filed: May 15, 2014

(65) Prior Publication Data

US 2015/0094116 A1 Apr. 2, 2015

(30) Foreign Application Priority Data

Sep. 27, 2013 (KR) .................. 10-2013-0115517

(51) Int. Cl.
| | | |
|---|---|---|
| H04B 1/44 | (2006.01) | |
| H03K 17/06 | (2006.01) | |
| H03K 17/10 | (2006.01) | |
| H03K 17/693 | (2006.01) | |
| H04B 1/525 | (2015.01) | |

(52) U.S. Cl.
CPC .......... *H03K 17/063* (2013.01); *H03K 17/102* (2013.01); *H03K 17/693* (2013.01); *H04B 1/44* (2013.01); *H04B 1/525* (2013.01)

(58) Field of Classification Search
CPC .......... H03K 17/687; H03K 17/3871; H03K 17/693; H03K 17/063; H04B 1/44; H04B 1/48
USPC .................................................. 455/78, 121
See application file for complete search history.

(56) References Cited

U.S. PATENT DOCUMENTS

| | | | | |
|---|---|---|---|---|
| 5,220,679 | A * | 6/1993 | Zametzer et al. | 455/78 |
| 5,896,563 | A * | 4/1999 | Kawanami et al. | 455/82 |
| 6,693,498 | B1 * | 2/2004 | Sasabata et al. | 333/103 |
| 7,199,635 | B2 * | 4/2007 | Nakatsuka et al. | 327/308 |
| 7,436,237 | B2 * | 10/2008 | Hikita et al. | 327/379 |
| 7,915,946 | B2 * | 3/2011 | Takahashi et al. | 327/427 |
| 8,200,167 | B2 * | 6/2012 | Koya | H04B 1/006 333/103 |
| 8,583,111 | B2 * | 11/2013 | Burgener et al. | 455/433 |
| 8,903,332 | B2 * | 12/2014 | Onody et al. | 455/77 |
| 2006/0252394 | A1* | 11/2006 | Suwa et al. | 455/201 |
| 2007/0290744 | A1* | 12/2007 | Adachi et al. | 330/51 |
| 2009/0181630 | A1* | 7/2009 | Seshita et al. | 455/191.3 |

(Continued)

FOREIGN PATENT DOCUMENTS

| | | |
|---|---|---|
| JP | 2011-228894 A | 11/2011 |
| KR | 2006-0094005 A | 8/2006 |
| KR | 10-2011-0068584 A | 6/2011 |

*Primary Examiner* — Duc M Nguyen
(74) *Attorney, Agent, or Firm* — NSIP Law

(57) ABSTRACT

A radio-frequency switch may include: a common port; a first signal transfer unit; and a second signal transfer unit, wherein the first signal transfer unit includes a first switch unit that has a plurality of switch circuit units, each of the plurality of switch circuit units having switches connected to each other with one forward-biased and another reverse-biased and being connected to a control terminal of respective switches in the first signal transfer part, and the second signal transfer unit includes a second switch unit that has a plurality of switch circuit units, each of the plurality of switch circuit units having switches connected to each other with one forward-biased and another reverse-biased and being connected to a control terminal of respective switches in the second signal transfer part.

22 Claims, 9 Drawing Sheets

(56) References Cited

U.S. PATENT DOCUMENTS

2010/0069020 A1* 3/2010 Koya .................... H04B 1/006
 455/78
2011/0140764 A1 6/2011 Shin et al.
2011/0254612 A1 10/2011 Kinoshita et al.
2014/0124908 A1* 5/2014 Sameshima et al. ......... 257/664
2014/0300401 A1* 10/2014 Kaggie ......................... 327/314

* cited by examiner

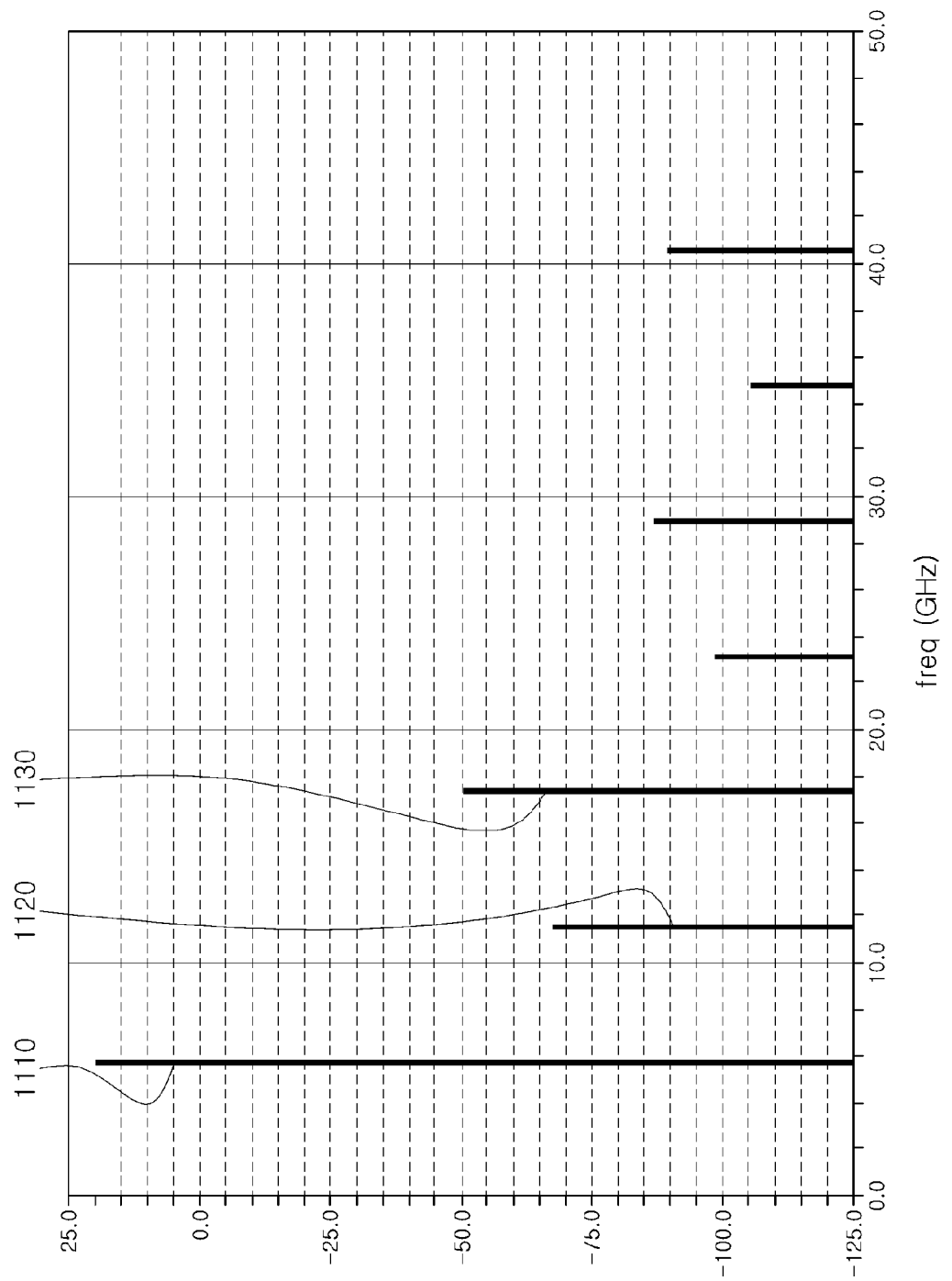

RADIO-FREQUENCY SWITCH

CROSS-REFERENCE TO RELATED APPLICATION

This application claims the benefit of Korean Patent Application No. 10-2013-0115517 filed on Sep. 27, 2013, with the Korean Intellectual Property Office, the disclosure of which is incorporated herein by reference.

BACKGROUND

The present disclosure relates to a radio-frequency switch.

In accordance with the development of wireless communications technology, various communications standards have been developed simultaneously. In addition, in accordance with the miniaturization of wireless communications modules and improvements in the performance of portable communications terminals, the need for individual portable communications terminals to conform to a plurality of communications standards has become apparent. Therefore, the amount of frequency bands that an individual portable communications terminal should be operable within has increased.

That is, existing second-generation (2G) and third-generation (3G) communications technologies have been supplemented with new communications technologies, such that portable communications terminals using fourth-generation (4G) communications schemes such as Long Term Evolution (LTE) have been developed. In addition, in the area of Wi-Fi communications, portable communications terminals have been implemented with the ability to operate with the IEEE 802.11ac standard in addition to the existing IEEE 802.11b/g/n to enhance marketability thereof.

In accordance with this trend, there has also been demand for support for various frequency bands within a radio frequency (RF) front end field. For example, support for various frequency bands with respect to a radio frequency switch positioned on a signal path between an antenna and an RF chipset has been demand. Therefore, a Single Pole Double Throw (SPDT) type switch has been used in various applications.

Radio frequency switches should be able to significantly decrease insertion loss in order to decrease loss of a signal and have excellent isolation properties, in order to significantly decrease interference between various frequency bands.

Patent Documents 1 and 2, listed below, relate to SPDT switches. However, the patent documents fail to disclose features of reducing insertion loss while achieving good isolation characteristics. In addition, the patent documents are silent on achieving linearity while improving start-up performance.

RELATED ART DOCUMENTS (Patent Document 1) Korean Patent Laid-Open Publication No. 2011-0068584
(Patent Document 2) Korean Patent Laid-Open Publication No. 2006-0094005

SUMMARY

An aspect of the present disclosure may provide a radio-frequency switch with reduced insertion loss and improved linearity and start-up performance, in which at least two diode-connected field effect transistors are connected, with one forward-biased and another reverse-biased, to a gate terminal of a field effect transistor that allows for or blocks the flow of a radio-frequency signal.

According to an aspect of the present disclosure, a radio-frequency switch may include: a common port connected to an antenna so as to transmit and receive first and second radio-frequency signals; a first signal transfer unit connected between the common port and a first port that inputs and outputs the first radio-frequency signal, the first signal transfer unit including a plurality of switches connected to one another in series; and a second signal transfer unit connected between the common port and a second port that inputs and outputs the second radio-frequency signal, the second signal transfer unit including a plurality of switches connected to one another in series, wherein the first signal transfer unit includes a first switch unit that has a plurality of switch circuit units, each of the plurality of switch circuit units having switches connected to each other with one forward-biased and another reverse-biased and being connected to a control terminal of respective switches in the first signal transfer part, and the second signal transfer unit includes a second switch unit that has a plurality of switch circuit units, each of the plurality of switch circuit units having switches connected to each other with one forward-biased and another reverse-biased and being connected to a control terminal of respective switches in the second signal transfer part.

The radio-frequency switch may further include: a plurality of gate resistors, each connected between a control terminal of a respective switch among the plurality of switches in the first signal transfer unit and a respective switch circuit unit among the plurality of switch circuit units in the first switch unit; and a plurality of gate resistors, each connected between a control terminal of a respective switch among the plurality of switches in the second signal transfer unit and a respective switch circuit unit among the plurality of switch circuit units in the second switch unit.

The radio-frequency switch may further include: a first shunt unit disposed between the first signal transfer unit and the first port so as to connect or disconnect the first port and ground; and a second shunt unit disposed between the second signal transfer unit and the second port so as to connect or disconnect the second port and ground.

The first shunt unit may include a third switch unit that has a plurality of switch circuit units, each of the plurality of switch circuit units having switches connected to each other with one forward-biased and another reverse-biased, and the second shunt unit may include a fourth switch unit that has a plurality of switch circuit units, each of the plurality of switch circuit units having switches connected to each other with one forward-biased and another reverse-biased, wherein each of the plurality of switch circuit units in the third switch unit may be connected to a control terminal of respective switches in the first shunt part, and each of the plurality of switch circuit units in the fourth switch unit may be connected to a control terminal of respective switches in the second shunt part.

The switches in the first to fourth switch units may be diode-connected field effect transistors (DC FETs) or diode-connected bipolar junction transistors (DC BJTs).

In the first switch unit, drain terminals of DC FETs may be connected to one another, and source terminals of the DC FETs may be connected to one another, such that the first gate signals to control switching of the plurality of switches in the first signal transfer unit may be applied to gate terminals of the DC FETs, and in the second switch unit, drain terminals of DC FETs may be connected to one another, and source terminals of the DC FETs may be connected to one another, such that the second gate signals to control switching of the plurality of switches in the second signal transfer unit may be applied to gate terminals of the DC FETs.

In the third switch unit, drain terminals of DC FETs may be connected to one another, and source terminals of the DC FETs may be connected to one another, such that the second gate signals to control switching of the plurality of switches in the first shunt unit may be applied to gate terminals of the DC FETs, and in the fourth switch unit, drain terminals of DC FETs may be connected to one another, and source terminals of the DC FETs may be connected to one another, such that the first gate signals to control switching of the plurality of switches in the second shunt unit may be applied to gate terminals of the DC FETs.

In the first switch unit, collector terminals of DC BJTs may be connected to one another, and emitter terminals of the DC BJTs may be connected to one another, such that the first gate signals to control switching of the plurality of switches in the first signal transfer unit may be applied to base terminals of the DC BJTs, and in the second switch unit, collector terminals of DC BJTs may be connected to one another, and emitter terminals of the DC BJTs may be connected to one another, such that the second gate signals to control switching of the plurality of switches in the second signal transfer unit may be applied to base terminals of the DC BJTs.

In the third switch unit, collector terminals of DC BJTs may be connected to one another, and emitter terminals of the DC BJTs may be connected to one another, such that the second gate signals to control switching of the plurality of switches in the first shunt unit may be applied to base terminals of the DC BJTs, and in the fourth switch unit, collector terminals of DC BJTs may be connected to one another, and emitter terminals of the DC BJTs may be connected to one another, such that the first gate signals to control switching of the plurality of switches in the second shunt unit may be applied to base terminals of the DC BJTs.

According to another aspect of the present disclosure, a radio-frequency switch may include: a first signal transfer unit including at least one switch and connecting or disconnecting a common port that transmits and receives a first radio-frequency signal and a first port that inputs and outputs the first radio-frequency signal; and a second signal transfer unit including at least one switch and connecting or disconnecting the common port that transmits and receives a second radio-frequency signal and a second port that inputs and outputs the second radio-frequency signal, wherein the first signal transfer unit includes at least two switches connected in parallel and in opposite directions to a control terminal of the at least one switch in the first signal transfer part, and the second signal transfer unit includes at least two switches connected in parallel and in opposite directions to a control terminal of the at least one switch in the second signal transfer part.

The first signal transfer unit may further include at least one gate resistor connected between the control terminal of the at least one switch in the first signal transfer unit and the at least two switches, and the second signal transfer unit may further include at least one gate resistor connected between the control terminal of the at least one switch in the second signal transfer unit and the at least two switches.

The first signal transfer unit may include at least one resistor connected to a gate terminal of the at least one switch and receive a first gate signal via the at least one resistor, and the second signal transfer unit may include at least one resistor connected to a gate terminal of the at least one switch and receive a second gate signal via the at least one resistor.

The at least two switches in each of the first and second signal transfer parts may be diode-connected field effect transistors (DC FETs).

In the first signal transfer part, drain terminals of the at least two switches may be connected to one another, and source terminals of the at least two switches may be connected to one another, such that first gate signals to control switching of the at least one switch in the first signal transfer unit may be applied to gate terminals of the at least two switches, and in the second signal transfer part, drain terminals of the at least two switches may be connected to one another, and source terminals of the at least two switches may be connected to one another, such that second gate signals to control switching of the at least one switch in the second signal transfer unit may be applied to gate terminals of the at least two switches.

The at least two switches in each of the first and second signal transfer parts may be diode-connected bipolar junction transistors (DC BJTs).

In the first signal transfer part, collector terminals of the at least two switches may be connected to one another, and emitter terminals of the at least two switches may be connected to one another, such that first gate signals to control switching of the at least one switch in the first signal transfer unit may be applied to base terminals of the at least two switches, and in the second signal transfer part, collector terminals of the at least two switches may be connected to one another, and emitter terminals of the at least two switches may be connected to one another, such that second gate signals to control switching of the at least one switch in the second signal transfer unit may be applied to base terminals of the at least two switches.

The radio-frequency switch may further include: a first shunt unit including at least one switch connected between the first signal transfer unit and the first port so as to connect or disconnect the first port and ground; and a second shunt unit including at least one switch connected between the second signal transfer unit and the second port so as to connect or disconnect the second port and ground, wherein the at least one switch in the first shunt unit has at least two switches connected to its control terminal in parallel and in opposite directions, and the at least one switch in the second shunt unit has at least two switches connected to its control terminal in parallel and in opposite directions.

The first shunt unit may include at least one resistor connected to the gate terminal of the at least one switch in the first shunt unit and receives a second gate signal via the at least one resistor, and the second shunt unit may include at least one resistor connected to the gate terminal of the at least one switch in the second shunt unit and receives a first gate signal via the at least one resistor.

The at least two switches in each of the first and second shunt parts may be diode-connected field effect transistors (DC FETs)

In the first shunt part, drain terminals of the at least two switches may be connected to one another, and source terminals of the at least two switches may be connected to one another, such that second gate signals to control switching of the at least one switch in the first shunt unit may be applied to gate terminals of the at least two switches, and in the second shunt part, drain terminals of the at least two switches may be connected to one another, and source terminals of the at least two switches may be connected to one another, such that first gate signals to control switching of the at least one switch in the second shunt unit may be applied to gate terminals of the at least two switches.

The at least two switches in each of the first and shunt parts may be diode-connected bipolar junction transistors (BJTs).

In the first shunt part, collector terminals of the at least two switches may be connected to one another, and emitter terminals of the at least two switches may be connected to one another, such that second gate signals to control switching of the at least one switch in the first shunt unit may be applied to base terminals of the at least two switches, and in the second shunt part, collector terminals of the at least two switches may be connected to one another, and emitter terminals of the at least two switches may be connected to one another, such that first gate signals to control switching of the at least one switch in the second shunt unit may be applied to base terminals of the at least two switches.

BRIEF DESCRIPTION OF DRAWINGS

The above and other aspects, features and other advantages of the present disclosure will be more clearly understood from the following detailed description taken in conjunction with the accompanying drawings, in which:

FIG. 12 is a graph illustrating the harmonic characteristics of the radio-frequency switch according to the exemplary embodiment of the present disclosure.

DETAILED DESCRIPTION

Figure 1:
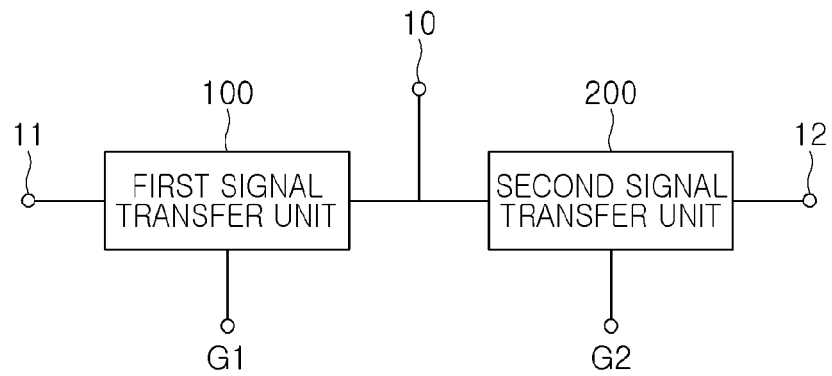
FIG. 1 is a block diagram of a radio-frequency switch according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a block diagram of a radio-frequency switch according to an exemplary embodiment of the present disclosure.

Figure 2:
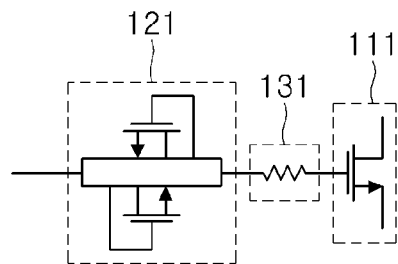
FIG. 2 is a circuit diagram of the block diagram illustrated in FIG. 1.

FIG. 2 is a circuit diagram of the block diagram illustrated in FIG. 1.

Figure 3:
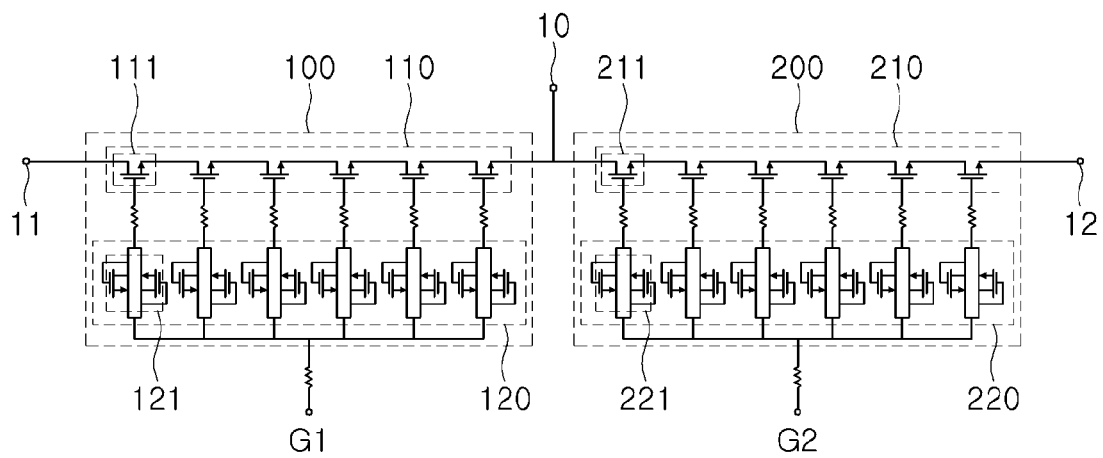
FIG. 3 is a diagram illustrating a circuit of switches configuring a radio-frequency switch according to an exemplary embodiment of the present disclosure.

FIG. 3 is a diagram illustrating a circuit of switches configuring a radio-frequency switch according to an exemplary embodiment of the present disclosure.

Referring to FIG. 1, the radio-frequency switch according to the exemplary embodiment may include a first signal transfer unit 100 and a second signal transfer unit 200.

The first signal transfer unit 100 may connect or disconnect a common port 10 that transmits and receives a first radio-frequency signal and a first port 11 that inputs and outputs the first radio-frequency signal.

The second signal transfer unit 200 may connect or disconnect the common port 10 that transmits and receives a second radio-frequency signal and a second port 12 that inputs and outputs the second radio-frequency signal.

Referring to FIG. 2, each of the first and second signal transfer parts 100 and 200 may include pluralities of switches 110 and 210 connected to one another in series, respectively. The first signal transfer unit 100 may include a first switch unit 120 including a plurality of switch circuit units, each of the switch circuit units having switches connected to each another with one forward-biased and another reverse-biased. Each of the plurality of switch circuit units may be connected to a control terminal of the respective switches 110 in the first signal transfer unit 100.

That is, referring to FIGS. 2 and 3, one switch 111 among the plurality of switches 110 in the first signal transfer unit 100 has a switch circuit unit 121 connected to its gate terminal. The switches 110 may be connected to one another in series, and each of the switches may have a switch circuit unit 121 connected to its gate terminal. The switch circuit unit 121 may include switches connected to each other with one forward-biased and another reverse-biased.

The first signal transfer unit 100 may include gate resistors 131 each connected to the gate terminal of one switch 111 among the plurality of switches 110. Further, the first signal transfer unit 100 may have pluralities of gate resistors, each of the pluralities of resistors connected to the gate terminal of each of the plurality of switches 110.

Referring to FIG. 3, the second signal transfer unit 200 may include a second switch unit 220 including a plurality of switch circuit units, each of the switching units having switches connected to each another with one forward-biased and another reverse-biased. Each of the plurality of switch circuit units may be connected to a control terminal of the respective switches 210 in the second signal transfer unit 200.

The switch circuits included in the second signal transfer unit 200 have the same configuration as that of switch circuits included in the first signal transfer unit 100 and, therefore, redundant descriptions will not be made.

The pluralities of switches 110 and 210 included in the first and second signal transfer parts 100 and 200, respectively, are connected to one another in series and may switched on and off upon receiving first and second gate signals G1 and G2 via respective resistors connected to their control terminals.

That is, the first and second signal transfer parts 100 and 200 may include the first and second switch units 120 and 220, respectively, which reduce the components of parasite capacitance in the pluralities of switches 110 and 210 connected to one another in series. Accordingly, linear operation can be achieved while start-up performance can be improved.

Figure 4:
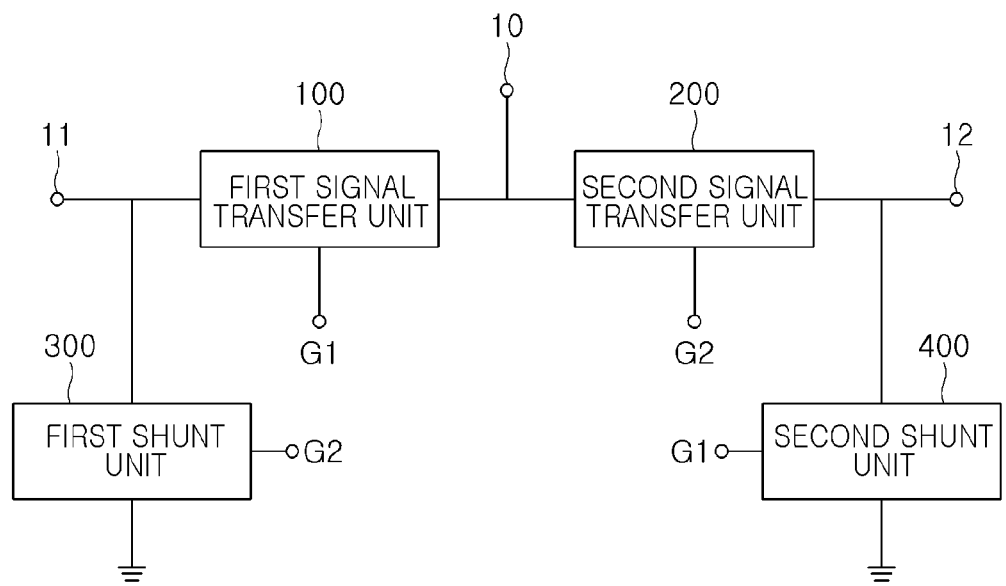
FIG. 4 is a block diagram of a radio-frequency switch according to another exemplary embodiment of the present disclosure.

FIG. 4 is a block diagram of a radio-frequency switch according to another exemplary embodiment of the present disclosure.

Figure 5:
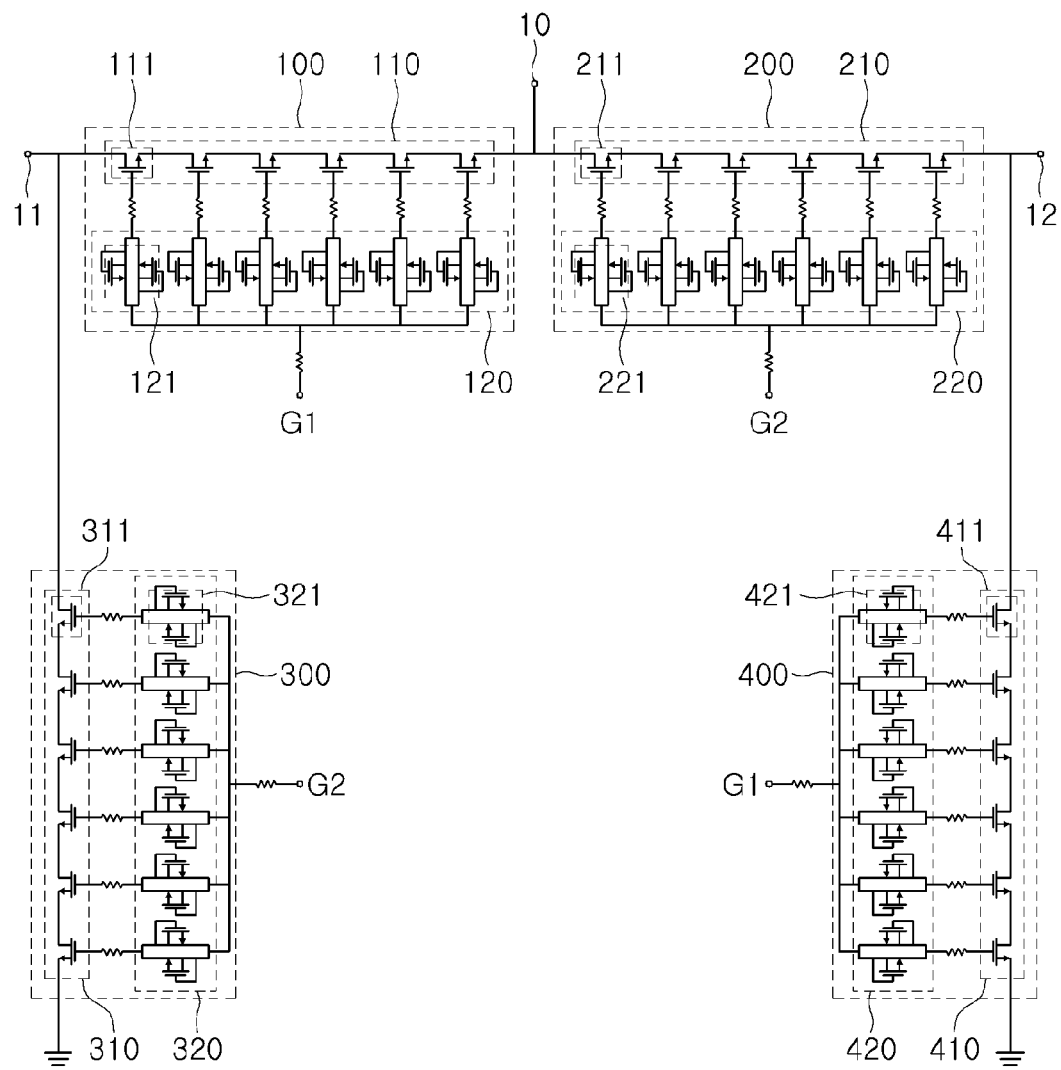
FIG. 5 is a circuit diagram of the block diagram illustrated in FIG. 4.

FIG. 5 is a circuit diagram of the block diagram illustrated in FIG. 4.

Referring to FIG. 4, the radio-frequency switch according to this exemplary embodiment may include a first shunt unit 300 and a second shunt unit 400, in addition to the first signal transfer unit 100 and the second signal transfer unit 200 described above.

The first shunt unit 300 may be disposed between the first signal transfer unit 100 and the first port 11 to connect or disconnect the first port 11 and ground. The second shunt unit 400 may be disposed between the second signal transfer unit 200 and the second port 12 to connect or disconnect the second port 12 and ground.

The first and second shunt parts 300 and 400 may include a plurality of switches 310 and a plurality of switches 410 connected to one another in series, respectively. Further, the first shunt unit 300 may include a third switch unit 320 including a plurality of switch circuit units having switches connected to each other with one forward-biased and another reverse-biased. The second shunt unit 400 may include a fourth switch unit 420 including a plurality of switch circuit units having switches connected to each other with one forward-biased and another reverse-biased. Each of switch circuit units in the third and fourth switch units 320 and 420 may be connected to the control terminal of the respective switches 310 and 410 in the first and second shunt parts 300 and 400.

In the first and second shunt parts 300 and 400, each of the switches 310 and 410 may have plural resistors connected to its gate terminal. Further, the pluralities of switches 310 and 410 included in the first and second shunt parts 300 and 400, respectively, are connected to one another in series and may switched on and off upon receiving second and first gate signals G2 and G1 via respective resistors connected to their control terminals.

The switches in the first to fourth switch units 120, 220, 320 and 420 may be diode-connected field effect transistors (DC FETs) or diode-connected bipolar junction transistors (DC BJTs).

That is, the first signal transfer unit 100, the second signal transfer unit 200, the first shunt unit 300 and the second shunt unit 400 may include at least one of DC FETs and DC BJTs.

According to an exemplary embodiment in which a plurality of DC FETs are included, drain terminals of the plurality of DC FETs in the first switch unit 120 may be connected to one another, and source terminals of the plurality of DC FETs 121 may be connected to one another, such that the first gate signals G1 to control switching of the plurality of switches 110 in the first signal transfer unit 100 may be applied to gate terminals of the DC FETs 121. Further, drain terminals of the plurality of DC FETs 221 in the second switch unit 220 may be connected to one another, and source terminals of the plurality of DC FETs 221 may be connected to one another, such that the second gate signals G2 to control switching of the plurality of switches 210 in the second signal transfer unit 200 may be applied to gate terminals of the DC FETs 221.

In addition, drain terminals of the plurality of DC FETs 321 in the third switch unit 320 may be connected to one another, and source terminals of the plurality of DC FETs 321 may be connected to one another, such that the second gate signals G2 to control switching of the plurality of switches 310 in the first shunt unit 300 may be applied. Moreover, drain terminals of the plurality of DC FETs 421 in the fourth switch unit 420 may be connected to one another, and source terminals of the plurality of DC FETs 421 may be connected to one another, such that the first gate signals G1 to control switching of the plurality of switches 410 in the second shunt unit 400 may be applied.

According to an exemplary embodiment in which a plurality of DC BJTs are included as the switches in each of the first to fourth switch units 120, 220, 320 and 420, collector terminals of the plurality of DC BJTs 121 in the first switch unit 120 may be connected to one another, and emitter terminals of the plurality of DC BJTs 121 may be connected to one another, such that the first gate signals G1 to control switching of the plurality of switches 110 in the first signal transfer unit 100 may be applied to base terminals of the DC BJTs 121. Further, collector terminals of the plurality of DC BJTs 221 in the second switch unit 220 may be connected to one another, and emitter terminals of the plurality of DC BJTs 221 may be connected to one another, such that the second gate signals G2 to control switching of the plurality of switches 210 in the second signal transfer unit 200 may be applied to base terminals of the DC BJTs 221.

Further, collector terminals of the plurality of DC BJTs 321 in the third switch unit 320 may be connected to one another, and emitter terminals of the plurality of DC BJTs 321 may be connected to one another, such that the second gate signals G2 to control switching of the plurality of switches 310 in the first shunt unit 300 may be applied to base terminals of the DC BJTs 321. Moreover, collector terminals of the plurality of DC BJTs 421 in the fourth switch unit 420 may be connected to one another, and emitter terminals of the plurality of DC BJTs 421 may be connected to one another, such that the first gate signals G1 to control switching of the plurality of switches 410 in the second shunt unit 400 may be applied to base terminals of the DC BJTs 421.

Although the FETs are illustrated in FIGS. 3 and 5 as the plurality of switches included in the first and second signal transfer parts 100 and 200 and the first and second shunt parts 300 and 400, exemplary embodiments of the present disclosure is not limited thereto but may be practiced with the above-mentioned BJTs.

In addition, although the FETs are N-channel FETs in FIG. 3, it is obvious to those skilled in the art that the FETs include P-channel FETs as well. Likewise, when the switches are the BJTs, NPN BJTs as well as PNP BJTs may be used.

Although six FETs are illustrated in FIGS. 3 and 5 as the switches for simplicity, exemplary embodiments of the present disclosure are not limited by the number.

Hereinafter, it is assumed for convenience of illustration that the first and second signal transfer parts 100 and 200 and the first and second shut parts 300 and 400 include the P-cannel FETs as the switches.

A radio-frequency switch may be connected to a common port 10 and first and second ports 11 and 12. As illustrated, one terminal of each of the first and second signal transfer parts 100 and 200 may be connected to the common port 10, the other terminal of the first signal transfer unit 100 may be connected to the first port 11, and the other terminal of the second signal transfer unit 200 may be connected to the second port 12. The common port 10 may be connected to an antenna that transmits or receives radio-frequency signal.

The first signal transfer unit 100 may transfer the radio-frequency signal received at the common port 10 through the antenna to the first port 11 as an input and transfer a radio-frequency signal output from the first port 11 to the common port 10 as a transmission signal.

In addition, the second signal transfer unit 200 may transfer the radio-frequency signal received at the common port 10 through the antenna to the second port 12 as an input and transfer a radio-frequency signal output from the second port 12 to the common port 10 as a transmission signal.

Here, the first and second signal transfer parts 100 and 200 may perform a function of transmitting the radio-frequency signal or a function of receiving the radio-frequency signal. For example, when the first signal transfer unit 100 performs the function of transferring a radio frequency signal to be transmitted, the second signal transfer unit 200 may perform the function of transferring a received radio frequency signal.

The first shunt unit 300 may be disposed between the first port 11 and ground, and the second shunt unit 400 may be disposed between the second port 12 and ground, and provide bypasses to ground for residual signals or the like in the first and second signal transfer parts 100 and 200.

Figure 6:
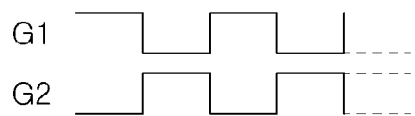
FIG. 6 is a diagram illustrating signals applied to gate terminals of switches included in a radio-frequency switch according to an exemplary embodiment of the present disclosure.

FIG. 6 is a diagram illustrating signals applied to gate terminals of switches included in a radio-frequency switch according to an exemplary embodiment of the present disclosure.

In the example of FIG. 5, the first signal transfer unit 100 may perform switching in the same manner with the second shunt unit 400, and the second signal transfer unit 200 may perform switching in the same manner with the first shunt unit 300.

Descriptions will be made with reference to FIGS. 5 and 6, on the assumption that the first gate signals G1 applied to the first signal transfer unit 100 and the second shunt unit 400 are high signals H, and the second gate signals G2 applied to the second signal transfer unit 200 and the first shunt unit 300 are low signals L.

The first signal transfer unit 100 may be turned on so that the first port 11 and the common port 10 are connected, and the second signal transfer unit 200 may be turned off so that the second port 12 and the common port 10 are disconnected. In addition, the first shunt unit 300 may be turned off so that the first port 11 and ground are disconnected, and the second shunt unit 400 may be turned on so that the second port 12 and ground are connected. In this instance, a path from the first port 11 to the common port 10 becomes available.

Therefore, in this instance, the first signal transfer unit 100 is operated in on-state, such that the first radio-frequency signal may be smoothly transferred between the first port 11 and the common port 10, and the second signal transfer unit 200 and the first shunt unit 300 are operated in off-state, such that an unnecessary flow of the first radio-frequency signal may be blocked. The second shunt unit 400 at the front end of the second port 12 is operated in on-state so as to prevent the first radio-frequency signal from being transferred to the second port 12, whereby isolation characteristics may be improved.

In the foregoing descriptions, the first signal transfer unit 100 and the second shunt unit 400 may receive the gate signals G1 of the same level so as to perform the same switching, and the second signal transfer unit 200 and the first shunt unit 300 may receive the gate signals G2 of the same level so as to perform the same switching. However, the exemplary embodiments of the present disclosure are not limited thereto, but the first signal transfer unit 100, the second signal transfer unit 200, the first shunt unit 300, and the second shunt unit 400 may also receive randomly determined first and fourth gate signals G1 to G4, respectively, to perform different switching.

That is, in the radio-frequency switch according to the exemplary embodiment of the present disclosure, the plurality of switches 110, 210, 310 and 410 that block or allow the flow of radio-frequency signals have the first to fourth switch units 120, 210, 310 and 410 that are diode-connected to their gate terminals. Accordingly, when high gate signals H are applied, the resistance component of the plurality of switches 110, 210, 310 and 410 and the resistance component of the first to fourth switch units 120, 220, 320 and 420 are connected in parallel, so that the total resistance component is reduced and thus insertion loss can be reduced.

Although improvement in the insertion loss and isolation characteristics has been described with respect to only the first signal transfer unit 100, it is obvious to those skilled in the art how to apply it to the second signal transfer unit 200. Further, although the above-mentioned description has been made with respect to the FETs, it is obvious to those skilled in the art how to practice with the BJTs.

Figure 7:
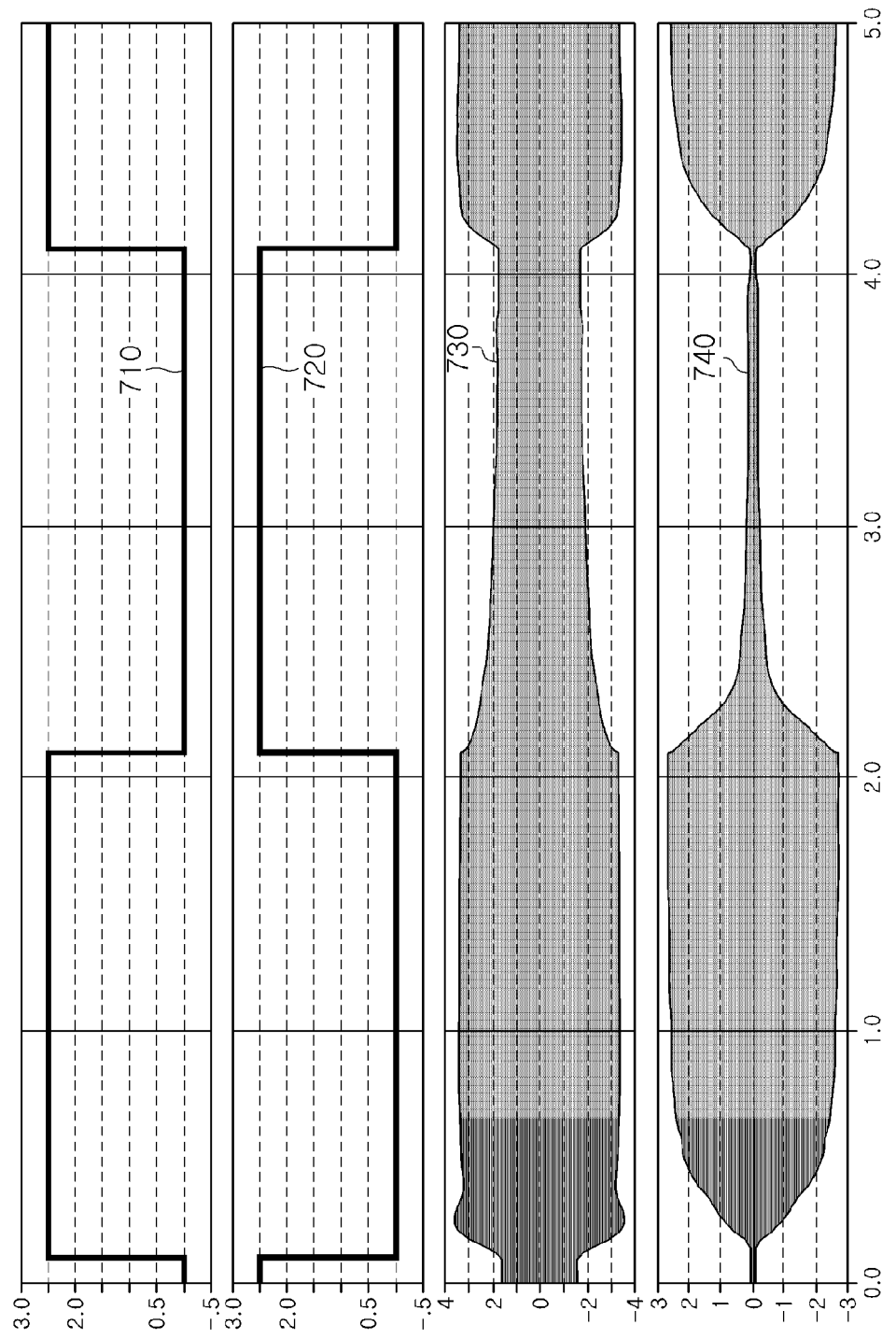
FIG. 7 is a diagram illustrating start-up time of a radio-frequency switch in the related art.

FIG. 7 is a diagram illustrating start-up time of a radio-frequency switch in the related art. The radio-frequency switch in the related art does not include the switch units according to exemplary embodiments of the present disclosure, which are connected to gate terminals of switches connected in series.

Figure 8:
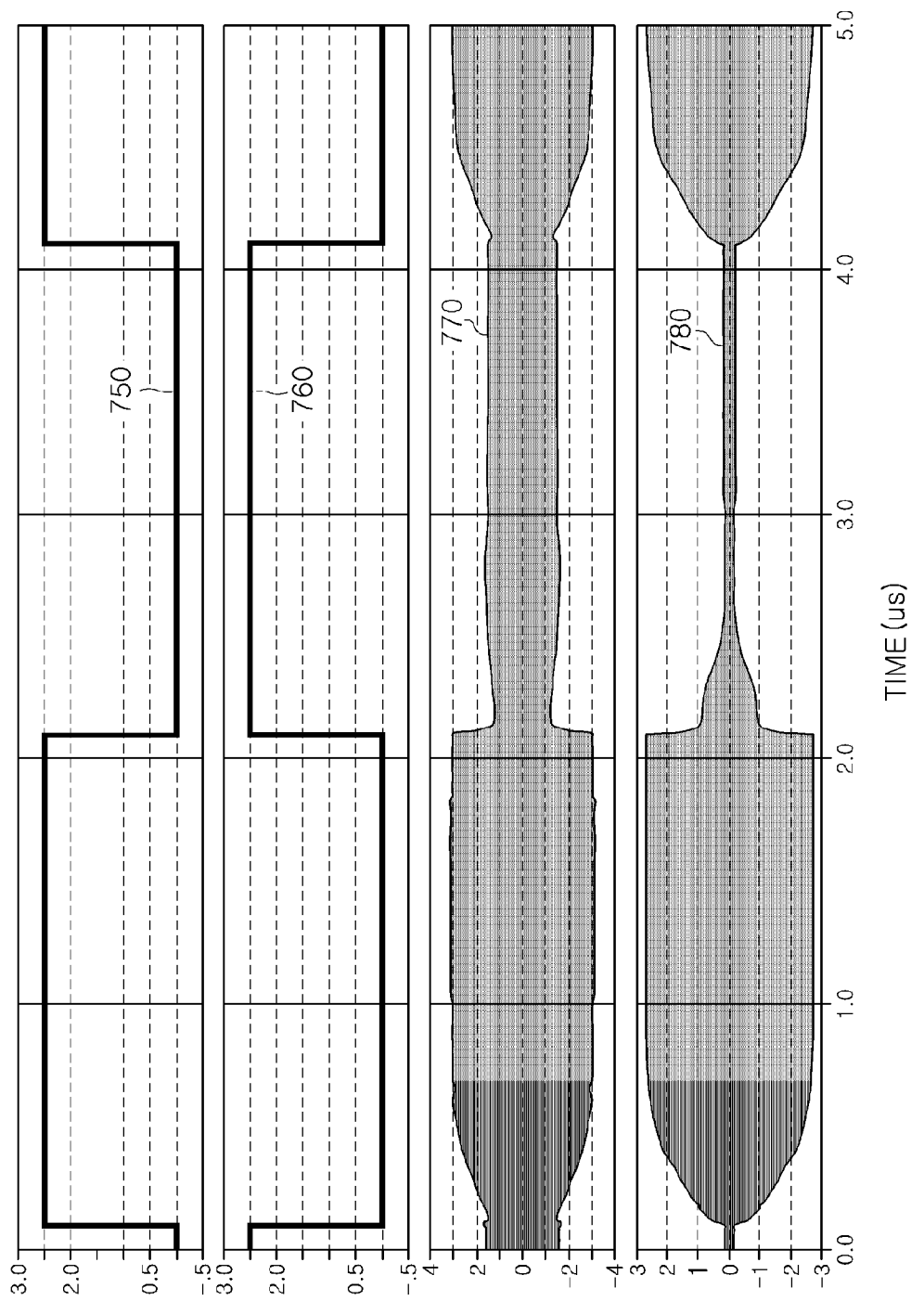
FIG. 8 is a diagram illustrating start-up time of a radio-frequency switch according to an exemplary embodiment of the present disclosure.

FIG. 8 is a diagram illustrating start-up time of a radio-frequency switch according to an exemplary embodiment of the present disclosure.

Referring to FIG. 7, the start-up time of the radio-frequency switch in the related art is 620 ns (720 ns-100 ns). Referring to FIG. 8, the start-up time of the radio-frequency switch according to the exemplary embodiment of the present disclosure is 446 ns (546 ns-100 ns). It can be seen that the start-up time of the radio-frequency switch according to the exemplary embodiment of the present disclosure has been improved over the related art.

Figure 9:
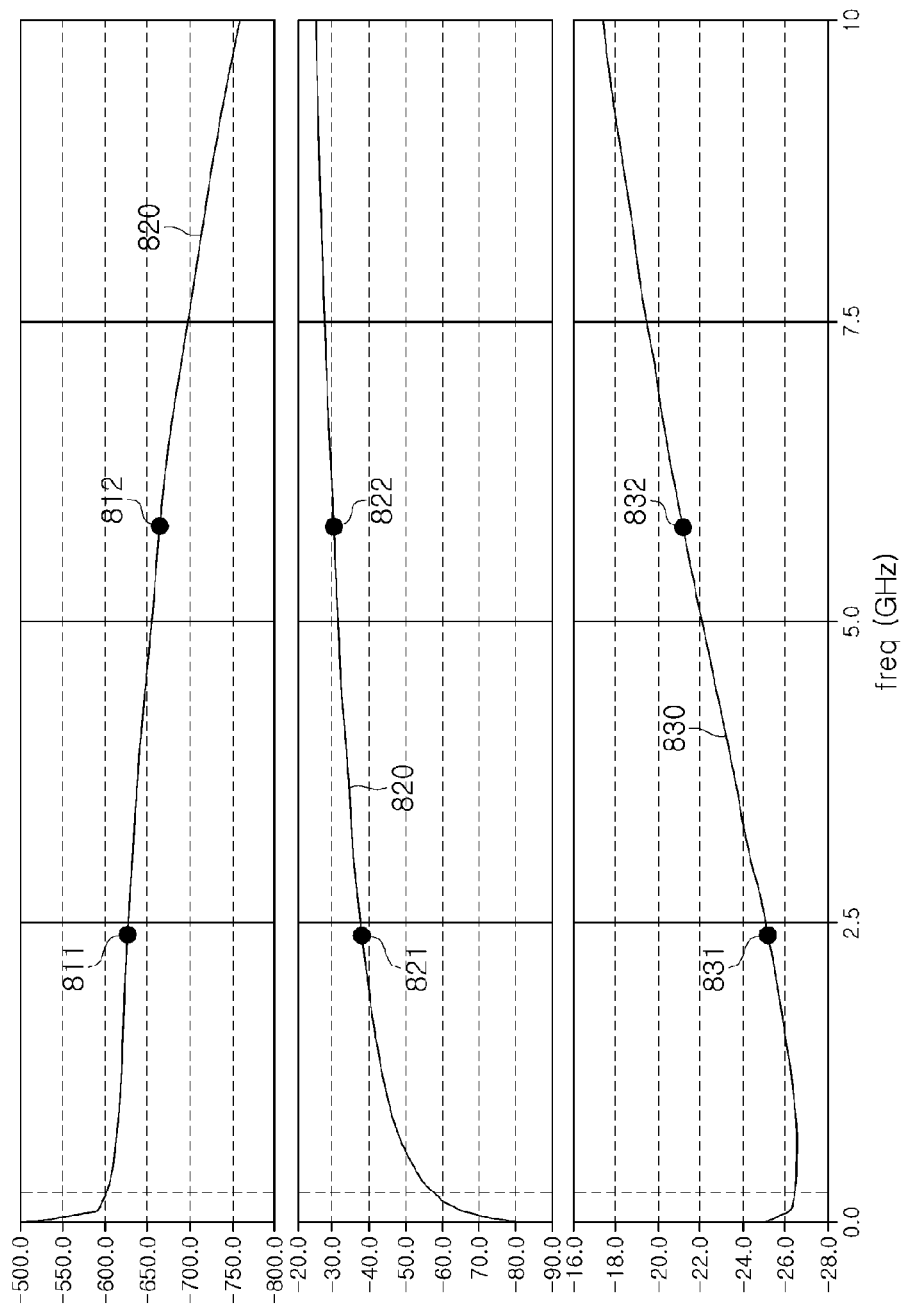
FIG. 9 is a diagram illustrating the small signal characteristics of a radio-frequency switch in the related art.

FIG. 9 is a diagram illustrating the small signal characteristics of a radio-frequency switch in the related art.

Figure 10:
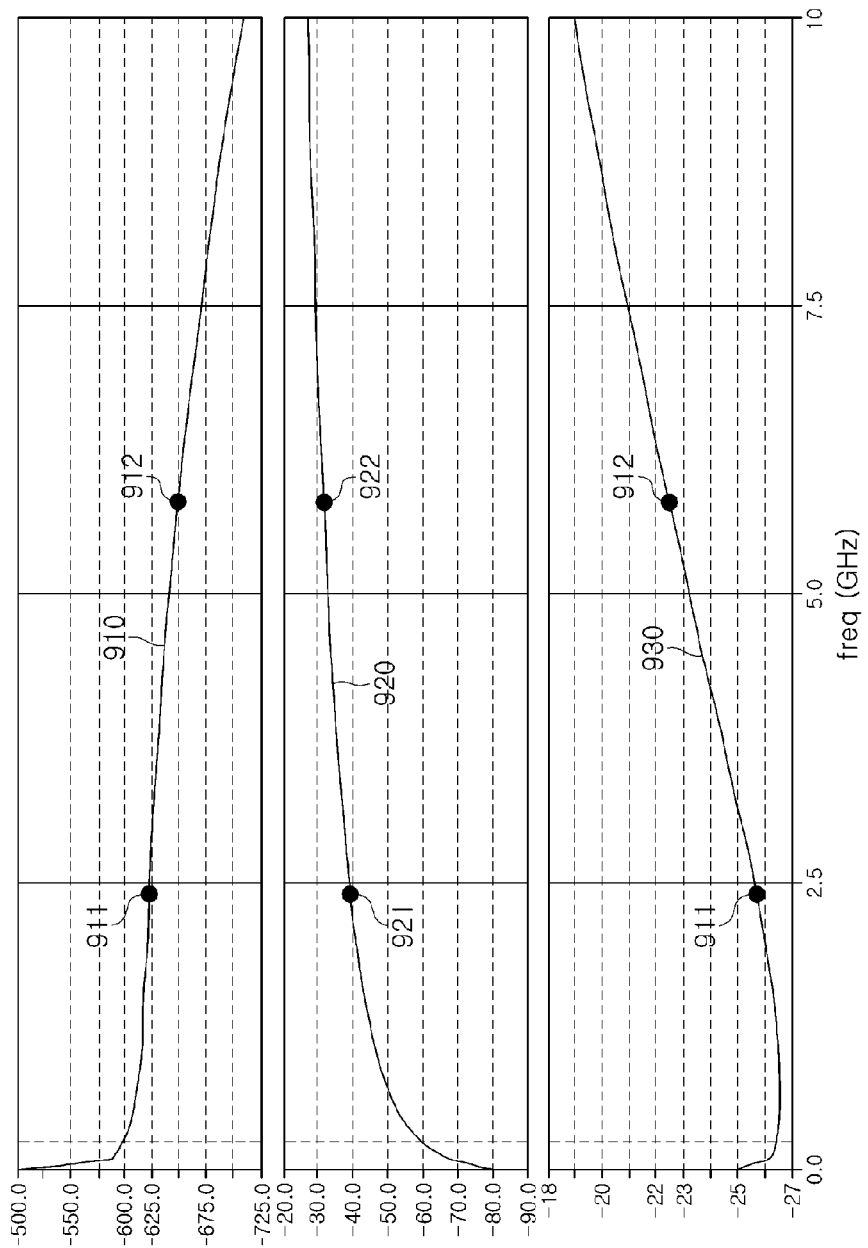
FIG. 10 is a block diagram illustrating the small signal characteristics of a radio-frequency according to an exemplary embodiment of the present disclosure.

FIG. 10 is a block diagram illustrating the small signal characteristics of a radio-frequency according to an exemplary embodiment of the present disclosure.

In the examples of FIGS. 9 and 10, eight switches are provided as a plurality of switches connected in series in signal transfer parts, and eight switches are provided as a plurality of switches in shunt parts. Table 1 below shows parameters of the radio-frequency switch according to the exemplary embodiment of the present disclosure.

TABLE 1

|  |  | Parameter |
|---|---|---|
| Plurality of Switches | Width | 1300 um |
| Length | 0.28 um |  |
| Rgate | 15 Kohm |  |
| Rgate_top | 3.5 Kohm |  |
| Rds | 17 Kohm |  |
| First to Fourth Switch Units | Width | 30 u |
| Length | 0.28 um |  |

Table 2 below shows results of simulation comparison of the radio-frequency switch according to the exemplary embodiment, which is configured with the parameters in Table 1, with the radio-frequency switch in the related art. Referring to Table 2 and FIGS. 9 and 10, it can be seen that insertion loss of the radio-frequency switch according to the exemplary embodiment is improved over the related art.

TABLE 2

| Parameter | | Vcont(On/Off) | | |
| --- | --- | --- | --- | --- |
| | | Related Art | Exemplary Embodiment of the Present Disclosure | |
| | | 2.5 V/0 V | 2.5 V/−2 V | 2.5 V/0 V |
| Insertion Loss[dB] | 2.4 GHz | 0.62 | 0.62 | 0.60 |
| | 5.8 GHz | 0.66 | 0.64 | 0.64 |
| Retrun Loss[dB] | 2.4 GHz | 25 | 25 | 24 |
| | 5.8 GHz | 21 | 22 | 21 |
| Isolation [dB] | 2.4 GHz | 37 | 39 | 37 |
| | 5.8 GHz | 30 | 32 | 30 |

Figure 11:
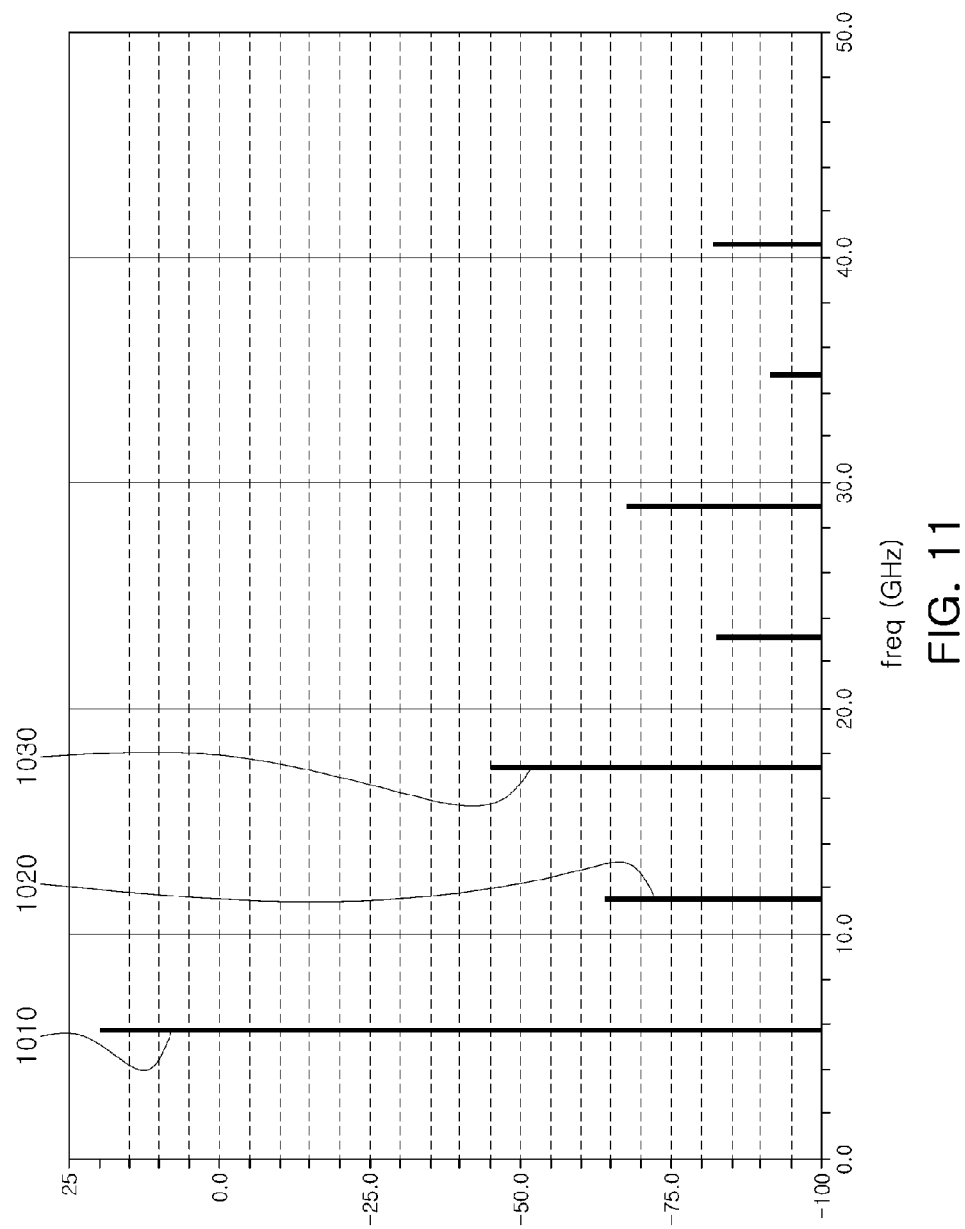
FIG. 11 is a graph illustrating the harmonic characteristics of a radio-frequency switch in the related art.

FIG. 11 is a graph illustrating the harmonic characteristics of the radio-frequency switch in the related art.

FIG. 12 is a graph illustrating the harmonic characteristics of the radio-frequency switch according to the exemplary embodiment of the present disclosure.

TABLE 3

| Parameter | | Vcont(On/Off) | | |
| --- | --- | --- | --- | --- |
| | | Related Art | Exemplary Embodiment of the Present Disclosure | |
| | | 2.5 V/0 V | 2.5 V/−2 V | 2.5 V/0 V |
| Input P0.1 dB[dBm] | 2.4 GHz | 22 | >33 | 22 |
| | 5.8 GHz | 23 | >33 | 23 |
| Input P1 dB[dBm] | 2.4 GHz | 30 | >33 | 30 |
| | 5.8 GHz | 30 | >33 | 30 |
| IIP2[dBm] | 2.4 GHz | 98 | 100 | 104 |
| | 5.8 GHz | 97 | 96 | 103 |
| IIP2[dBm] | 2.4 GHz | 53 | 56 | 53 |
| | 5.8 GHz | 54 | 53 | 54 |
| 2nd Harmonic[dBc] | 2.4 GHz | −81 | −87 | −88 |
| | 5.8 GHz | −84 | −87 | −91 |
| 3nd Harmonic[dBc] | 2.4 GHz | −69 | −78 | −71 |
| | 5.8 GHz | −65 | −70 | −65 |

Referring to Table 3 and FIGS. 11 and 12, it can be seen that insertion loss, return loss and isolation characteristics of the radio-frequency switch according to the exemplary embodiment are improved over the related art.

As set forth above, according to exemplary embodiments of the present disclosure, insertion loss can be reduced by decreasing total resistance components when the flow of a radio-frequency signal is allowed and isolation characteristics can be improved by increasing total capacitance components when the flow of a radio-frequency signal is blocked, by way of connecting at least two diode-connected field effect transistors, with one forward-biased and another reverse-biased, to a gate terminal of a field effect transistor that allows or blocks the flow of a radio-frequency signal. Further, according to exemplary embodiments of the present disclosure, linearity and start-up performance can be improved.

While exemplary embodiments have been shown and described above, it will be apparent to those skilled in the art that modifications and variations could be made without departing from the spirit and scope of the present disclosure as defined by the appended claims.

What is claimed is:

1. A radio-frequency switch, comprising:
   a common port connected to an antenna so as to transmit and receive first and second radio-frequency signals;
   a first signal transfer unit connected between the common port and a first port that inputs and outputs the first radio-frequency signal, the first signal transfer unit including a plurality of switches connected to one another in series; and
   a second signal transfer unit connected between the common port and a second port that inputs and outputs the second radio-frequency signal, the second signal transfer unit including a plurality of switches connected to one another in series,
   wherein the first signal transfer unit includes a first switch unit that has a plurality of switch circuit units, each of the plurality of switch circuit units having switches connected to each other with one forward-biased and another reverse-biased and being connected to a control terminal of respective switches in the first signal transfer part, and
   the second signal transfer unit includes a second switch unit that has a plurality of switch circuit units, each of the plurality of switch circuit units having switches connected to each other with one forward-biased and another reverse-biased and being connected to a control terminal of respective switches in the second signal transfer part.

2. The radio-frequency switch of claim 1, further comprising:
   a plurality of gate resistors, each connected between a control terminal of a respective switch among the plurality of switches in the first signal transfer unit and a respective switch circuit unit among the plurality of switch circuit units in the first switch unit; and
   a plurality of gate resistors, each connected between a control terminal of a respective switch among the plurality of switches in the second signal transfer unit and a respective switch circuit unit among the plurality of switch circuit units in the second switch unit.

3. The radio-frequency switch of claim 1, further comprising:
   a first shunt unit disposed between the first signal transfer unit and the first port so as to connect or disconnect the first port and ground; and
   a second shunt unit disposed between the second signal transfer unit and the second port so as to connect or disconnect the second port and ground.

4. The radio-frequency switch of claim 3, wherein the first shunt unit includes a third switch unit that has a plurality of switch circuit units, each of the plurality of switch circuit units having switches connected to each other with one forward-biased and another reverse-biased, and
   the second shunt unit includes a fourth switch unit that has a plurality of switch circuit units, each of the plurality of switch circuit units having switches connected to each other with one forward-biased and another reverse-biased, wherein
   each of the plurality of switch circuit units in the third switch unit is connected to a control terminal of respective switches in the first shunt part, and each of the plurality of switch circuit units in the fourth switch unit is connected to a control terminal of respective switches in the second shunt part.

5. The radio-frequency switch of claim 4, wherein the switches in the first to fourth switch units are diode-connected field effect transistors (DC FETs) or diode-connected bipolar junction transistors (DC BJTs).

6. The radio-frequency switch of claim 5, wherein
in the first switch unit, drain terminals of DC FETs are connected to one another, and source terminals of the DC FETs are connected to one another, such that first gate signals to control switching of the plurality of switches in the first signal transfer unit are applied to gate terminals of the DC FETs, and
in the second switch unit, drain terminals of DC FETs are connected to one another, and source terminals of the DC FETs are connected to one another, such that second gate signals to control switching of the plurality of switches in the second signal transfer unit are applied to gate terminals of the DC FETs.

7. The radio-frequency switch of claim 5, wherein
in the third switch unit, drain terminals of DC FETs are connected to one another, and source terminals of the DC FETs are connected to one another, such that second gate signals to control switching of the plurality of switches in the first shunt unit are applied to gate terminals of the DC FETs, and
in the fourth switch unit, drain terminals of DC FETs are connected to one another, and source terminals of the DC FETs are connected to one another, such that first gate signals to control switching of the plurality of switches in the second shunt unit are applied to gate terminals of the DC FETs.

8. The radio-frequency switch of claim 5, wherein
in the first switch unit, collector terminals of DC BJTs are connected to one another, and emitter terminals of the DC BJTs are connected to one another, such that first gate signals to control switching of the plurality of switches in the first signal transfer unit are applied to base terminals of the DC BJTs, and
in the second switch unit, collector terminals of DC BJTs are connected to one another, and emitter terminals of the DC BJTs are connected to one another, such that second gate signals to control switching of the plurality of switches in the second signal transfer unit are applied to base terminals of the DC BJTs.

9. The radio-frequency switch of claim 5, wherein
in the third switch unit, collector terminals of DC BJTs are connected to one another, and emitter terminals of the DC BJTs are connected to one another, such that second gate signals to control switching of the plurality of switches in the first shunt unit are applied to base terminals of the DC BJTs, and
in the fourth switch unit, collector terminals of DC BJTs are connected to one another, and emitter terminals of the DC BJTs are connected to one another, such that first gate signals to control switching of the plurality of switches in the second shunt unit are applied to base terminals of the DC BJTs.

10. A radio-frequency switch, comprising:
a first signal transfer unit including at least one switch and connecting or disconnecting a common port that transmits and receives a first radio-frequency signal and a first port that inputs and outputs the first radio-frequency signal; and
a second signal transfer unit including at least one switch and connecting or disconnecting the common port that transmits and receives a second radio-frequency signal and a second port that inputs and outputs the second radio-frequency signal, wherein the first signal transfer unit includes at least two switches connected in parallel and in opposite directions to a control terminal of the at least one switch in the first signal transfer part, the at least two switches of the first transfer unit are connected between the control terminal of the at least one switch and a gate terminal for a first gate signal, and
the second signal transfer unit includes at least two switches connected in parallel and in opposite directions to a control terminal of the at least one switch in the second signal transfer part.

11. The radio-frequency switch of claim 10, wherein
the first signal transfer unit further includes at least one gate resistor connected between the control terminal of the at least one switch in the first signal transfer unit and the at least two switches, and
the second signal transfer unit further includes at least one gate resistor connected between the control terminal of the at least one switch in the second signal transfer unit and the at least two switches.

12. The radio-frequency switch of claim 10, wherein
the first signal transfer unit includes at least one resistor connected to a gate terminal of the at least one switch and receives the first gate signal via the at least one resistor, and
the second signal transfer unit includes at least one resistor connected to a gate terminal of the at least one switch and receives a second gate signal via the at least one resistor.

13. The radio-frequency switch of claim 10, wherein the at least two switches in each of the first and second signal transfer parts are diode-connected field effect transistors (DC FETs).

14. The radio-frequency switch of claim 13, wherein
in the first signal transfer part, drain terminals of the at least two switches are connected to one another, and source terminals of the at least two switches are connected to one another, such that first gate signals to control switching of the at least one switch in the first signal transfer unit are applied to gate terminals of the at least two switches, and
in the second signal transfer part, drain terminals of the at least two switches are connected to one another, and source terminals of the at least two switches are connected to one another, such that second gate signals to control switching of the at least one switch in the second signal transfer unit are applied to gate terminals of the at least two switches.

15. The radio-frequency switch of claim 10, wherein the at least two switches in each of the first and second signal transfer parts are diode-connected bipolar junction transistors (DC BJTs).

16. The radio-frequency switch of claim 15, wherein
in the first signal transfer part, collector terminals of the at least two switches are connected to one another, and emitter terminals of the at least two switches are connected to one another, such that first gate signals to control switching of the at least one switch in the first signal transfer unit are applied to base terminals of the at least two switches, and
in the second signal transfer part, collector terminals of the at least two switches are connected to one another, and emitter terminals of the at least two switches are connected to one another, such that second gate signals to control switching of the at least one switch in the second signal transfer unit are applied to base terminals of the at least two switches.

17. The radio-frequency switch of claim 10, further comprising:
- a first shunt unit including at least one switch connected between the first signal transfer unit and the first port so as to connect or disconnect the first port and ground; and
- a second shunt unit including at least one switch connected between the second signal transfer unit and the second port so as to connect or disconnect the second port and ground,
- wherein the at least one switch in the first shunt unit has at least two switches connected to its control terminal in parallel and in opposite directions, and
- the at least one switch in the second shunt unit has at least two switches connected to its control terminal in parallel and in opposite directions.

18. The radio-frequency switch of claim 17, wherein
the first shunt unit includes at least one resistor connected to the gate terminal of the at least one switch in the first shunt unit and receives a second gate signal via the at least one resistor, and
the second shunt unit includes at least one resistor connected to the gate terminal of the at least one switch in the second shunt unit and receives the first gate signal via the at least one resistor.

19. The radio-frequency switch of claim 17, wherein the at least two switches in each of the first and second shunt parts are diode-connected field effect transistors (DC FETs).

20. The radio-frequency switch of claim 19, wherein
in the first shunt part, drain terminals of the at least two switches are connected to one another, and source terminals of the at least two switches are connected to one another, such that second gate signals to control switching of the at least one switch in the first shunt unit are applied to gate terminals of the at least two switches, and
in the second shunt part, drain terminals of the at least two switches are connected to one another, and source terminals of the at least two switches are connected to one another, such that first gate signals to control switching of the at least one switch in the second shunt unit are applied to gate terminals of the at least two switches.

21. The radio-frequency switch of claim 17, wherein the at least two switches in each of the first and shunt parts are diode-connected bipolar junction transistors (DC BJTs).

22. The radio-frequency switch of claim 21, wherein
in the first shunt part, collector terminals of the at least two switches are connected to one another, and emitter terminals of the at least two switches are connected to one another, such that second gate signals to control switching of the at least one switch in the first shunt unit are applied to base terminals of the at least two switches, and
in the second shunt part, collector terminals of the at least two switches are connected to one another, and emitter terminals of the at least two switches are connected to one another, such that first gate signals to control switching of the at least one switch in the second shunt unit are applied to base terminals of the at least two switches.

* * * * *